(12) United States Patent
Akahori

(10) Patent No.: US 7,711,010 B2
(45) Date of Patent: May 4, 2010

(54) PHASE-LOCKED LOOP FOR MAINTAINING SYSTEM SYNCHRONIZATION THROUGH PACKET DROPOUT

(75) Inventor: Hiroji Akahori, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 490 days.

(21) Appl. No.: 11/708,006

(22) Filed: Feb. 20, 2007

(65) Prior Publication Data

US 2007/0195829 A1 Aug. 23, 2007

(30) Foreign Application Priority Data

Feb. 21, 2006 (JP) ............................. 2006-043939

(51) Int. Cl.
*H04J 3/06* (2006.01)
(52) U.S. Cl. ..................... 370/516; 375/294; 327/156
(58) Field of Classification Search ......... 370/503–516; 375/215, 293–294; 327/141, 155, 156
See application file for complete search history.

(56) References Cited

U.S. PATENT DOCUMENTS

2002/0075981 A1 * 6/2002 Tang et al. ................... 375/376

FOREIGN PATENT DOCUMENTS

JP 3159981 4/1992

\* cited by examiner

*Primary Examiner*—Ricky Ngo
*Assistant Examiner*—Pao Sinkantarakorn
(74) *Attorney, Agent, or Firm*—Studebaker & Brackett PC; Donald R. Studebaker

(57) ABSTRACT

A phase-locked loop for maintaining system synchronization of a receiver with a transmitter through packet dropout. A clock signal is generated by an oscillator and the interval between the neighboring pieces of incoming system timing information is determined by a first packet counter. A second packet counter determines the interval between neighboring timing signals generated by the first packet counter. Two count values of the system timing information are retained by a delay buffer. In accordance with a value of comparison which is obtained by a difference circuit from the difference between the two count values and is larger or smaller than an error expected on system synchronization, the counter value is corrected by an overflow corrector. A cumulative offset of the clock position is corrected by a phase difference detector. The corrected offset is integrated by an integrator only at a timing of the system timing information incoming.

1 Claim, 2 Drawing Sheets

PHASE-LOCKED LOOP FOR MAINTAINING SYSTEM SYNCHRONIZATION THROUGH PACKET DROPOUT

BACKGROUND OF THE INVENTION

1. Field of the Invention

The present invention relates to a phase-locked loop (PLL) for establishing system synchronization between a transmitter and a receiver, and more particularly to a phase-locked loop for maintaining system synchronization of a receiver with a transmitter through packet dropout in a wireless communications system of packet transmission.

2. Description of the Background Art

Recently, a transmitter and a receiver included in a packet transmission system for implementing wireless communication have come into use. The receiver establishes system synchronization based on the system timing information contained in a packet transmitted from the transmitter. The transmitter assembles a transmission packet having its length, transmission interval and format regulated all the time. The receiver is responsive to system timing information incoming periodically on a packet to restore the operating timing of the transmitter to establish synchronization with the transmitter. A phase-locked loop for establishing such system synchronization is disclosed in, for example, Japanese Patent No. 3159981.

With the above-described conventional system, in which the operational timing on the receiver is defined by system timing information periodically supplied, it is essential that the system timing information is always received. Hence, if optimal wireless network circumstances cannot be secured to interrupt consecutive packet reception, then so-called packet dropout may be caused to give rise to a void in the timing information so as to raise a serious error in the correction information for recovering timing, with the result that it may become necessary to re-establish the system synchronization from the outset. Such re-synchronization would cause the system synchronization to be once marred critically.

In the phase-locked loop, if a period of time in which the phase-locked loop cannot trace the timing is so long as to cause packet dropout and thereafter the system information is recovered, then error in temporal position is cumulatively increased of the clock for receiver system operation with respect to the system timing information. In an attempt to recover the system synchronization, if the frequency of the clock for receiver system operation is corrected, then the increased cumulative error would cause the frequency of the clock for receiver system operation to drastically be shifted, thus destabilizing the system synchronization.

On the other hand, if the clock frequency of a clock on the receiver circuitry, detecting the system timing information, is not synchronous with the frequency of the clock for receiver system operation, which is in operation under system synchronization, both frequencies are also not synchronous with the clock used for generating the system timing information on the transmitter. The clock for receiver system operation and the clock used for generating system timing information may hereinafter be referred to as a clock for receiver system operation and a clock for transmitter system operation, respectively. It is thus required to use those three clock frequencies, not synchronous with each other, to establish system synchronization for synchronizing the frequency of the clock for receiver system operation with the frequency of the clock for transmitter system operation.

Heretofore, if an acoustic system is to be incorporated into a communications system, it has been necessary to design the acoustic system based upon the communications system or vice versa. In case any existing communications and acoustic systems are to be utilized without modification, a third frequency, such as voice signal sampling frequency, has to be used for system designing. The conventional phase-locked loop is, however, not up to this request.

SUMMARY OF THE INVENTION

It is therefore an object of the present invention to provide a phase-locked loop for maintaining system synchronization of a receiver with a transmitter through packet dropout such that system synchronization may be established despite of packet dropout.

In accordance with the present invention, there is provided a phase-locked loop for maintaining system synchronization between a transmitter and a receiver in a wireless communications system of packet transmission. The phase-locked loop includes an oscillator having an oscillation frequency controlled by a control signal for generating a clock for receiver system operation. The phase-locked loop also includes a first counter operative directly in response to the clock for receiver system operation. The first counter autonomously counts the clock recursively at a period of incoming system timing information estimated to generate a first count value every period of the incoming system timing information. The phase-locked loop also includes a second counter for counting a circuit clock of the receiver distinct from the clock for system operation to generate a second count value, which is reset in response to the first count value. The phase-locked loop also includes a holding circuit for holding the second count values corresponding to at least two packet intervals and detecting the system timing information transmitted from the transmitter. The phase-locked loop also includes a difference circuit for comparing a temporally previous second count value held by the holding circuit with a temporally posterior second count value. The phase-locked loop further includes adder/subtractor for subtracting ¥ from or adding to an output of the difference circuit a value equivalent to an estimated period of incoming system timing information which is estimated with the circuit clock taken into account if the output of the difference circuit is, respectively, larger or smaller than a value expected with the system synchronization taken into account. Furthermore, the phase-locked loop also includes a phase difference detector for changing the value obtained by the adder/subtractor to zero to output the resulting zero if the value obtained by the adder/subtractor is larger than a reference value expected with the system synchronization taken into account, and otherwise directly outputting the value obtained by the adder/subtractor. Moreover, the phase-locked loop also includes integrator for integrating an output of the phase difference detector, on acquisition of the system timing information from the transmitter to apply the result of integration to the oscillator as the control signal. The system synchronization of the receiver with the transmitter is thereby substantially maintained through packet dropout.

In accordance with the present invention, there is also provided a phase-locked loop for maintaining system synchronization between a transmitter and a receiver in a wireless communications system of packet transmission, wherein the phase-locked loop comprises a phase difference detector for calculating a time difference between previous receiving timing and current receiving timing, an integrator for integrating the time difference if the current receiving timing is correctly received, and an oscillator operative in response to on an output of the integrator for adjusting a clock signal frequency to output an adjusted clock signal, whereby the system synchronization of the receiver with the transmitter is substantially maintained through packet dropout.

According to the present invention, a count operation is carried out by the second counter, and two count values of the system timing information are held by the holding circuit and compared to each other by the difference circuit. System synchronization may be established using three clocks not synchronous with each other, namely the clock of the receiver circuit for detecting the system information, the clock for receiver system operation and the clock for transmitter system operation.

Moreover, when the count value of the second counter is varied significantly, depending on the incoming timing of the system information, an output of the difference circuit may have its overflow corrected by the adder/subtractor, such as to cope with rapid changes in the count value and to provide for stabilized system synchronization. In addition, when a value obtained by the adder/subtractor is greater than a reference value that may be postulated from the perspective of system synchronization, the phase difference detector may determine that a cumulative error of the clock position is great, in which case the phase difference detector may convert the value to zero to output the resulting zero. In such a case, system synchronization may be stabilized without appreciably affecting the frequency of the clock for receiver system operation. In other words, there may be provided a phase-locked loop maintaining system synchronization of a receiver with a transmitter through packet dropout.

Throughout the present application, the words "packet dropout" have to broadly be understood such as to cover the possibility of, e.g. failure to receive a packet or reception of a packet defective or inappropriate to the extent that system timing information is not extracted.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENT

Figure 1:
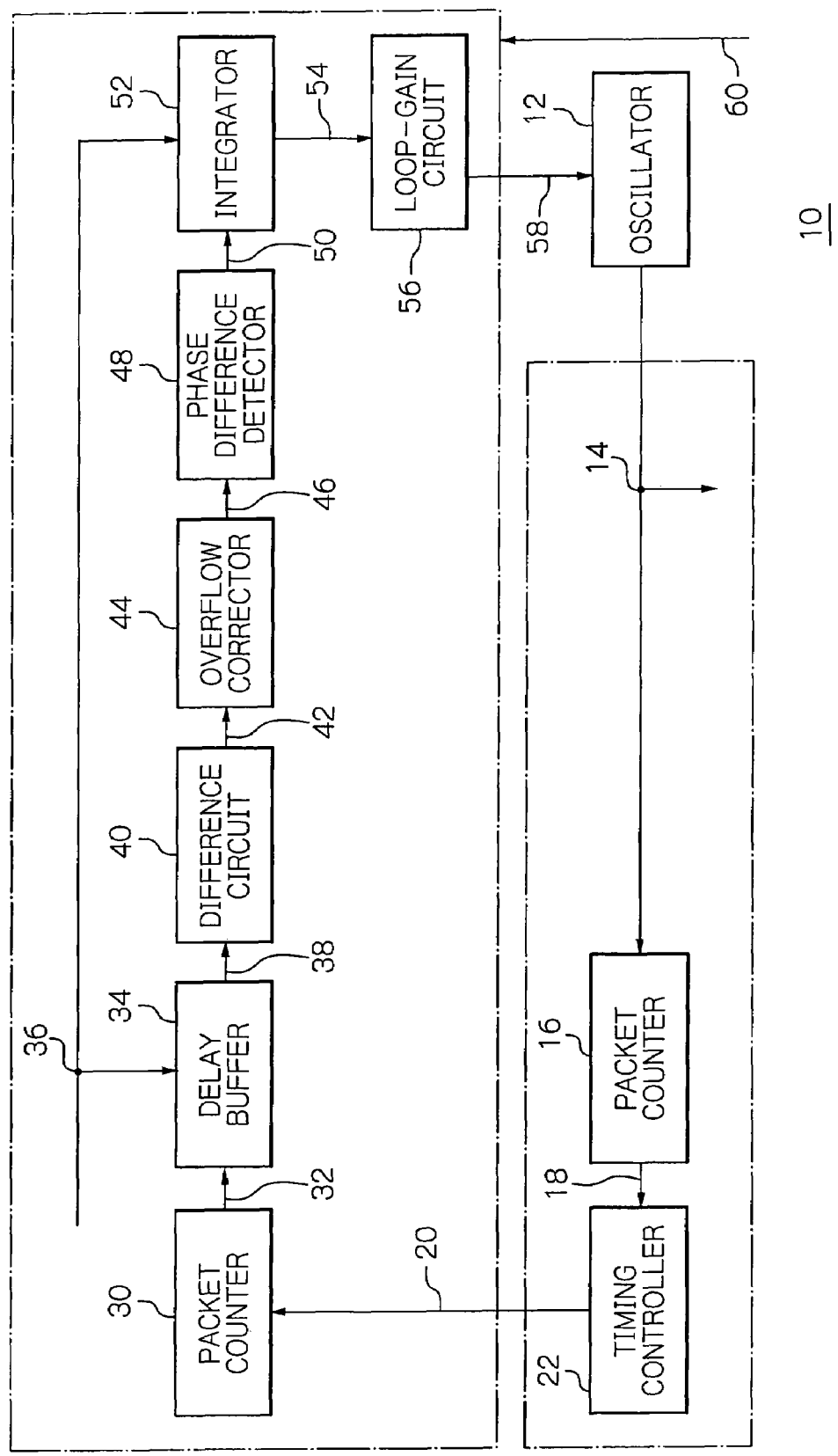
FIG. 1 is a schematic block diagram showing an embodiment of a phase-locked loop for maintaining system synchronization through packet dropout.

With reference to the accompanying drawings, a preferred embodiment of a phase-locked loop for maintaining system synchronization through packet dropout will be described in detail in accordance with the present invention. FIG. 1 shows an illustrative embodiment of a phase-locked loop (PLL) 10 for maintaining system synchronization through packet dropout according to the present invention. The phase-locked loop 10 may be provided in a receiver adapted for receiving a wireless or radio signal, transmitted over a wireless path or air from a transmitter and demodulating the wireless signal to extract a packet carried on the signal. The phase-locked loop 10 generates a clock signal 14 used for the receiver system operation under the PLL function. In the description to follow, parts or components not directly pertinent to understanding the present invention will neither be shown nor described.

The phase-locked loop 10 includes a packet counter 16 and a timing controller 22 which are interconnected as illustrated.

The packet counter 16 is adapted to be operative in response to the clock signal for receiver system operation 14, generated by an oscillator 12, to count the clock signal for receiver system operation 14 to determine a time interval between the neighboring timings, or a period, of the incoming system timing information 36. The timing controller 22 is adapted to transfer an output 18 from the packet counter 16 to its output 20 with the timing adjusted. In the following, signals are designated with reference numerals for connections on which they are conveyed. The packet counter 16 and the timing controller 22 are run in timed with the clock signal for receiver system operation 14, sometimes referred to simply as a clock signal, functioning as its operational clock.

The packet counter 16 is adapted for counting up the clock signal 14 during a time interval which is estimated between neighboring pieces of incoming system timing information 36 to hold its count corresponding to the interval. The packet counter 16 autonomously recursively increments and is initialized every period of the incoming timing information thus estimated to define the time interval thus estimated between neighboring pieces of system timing information 36. The packet counter 16 develops a count value at the reset timing on its output 18.

The phase-locked loop 10 has another packet counter 30 connected to the output line 20 of the timing controller 22. The packet counter 30 is adapted to count a circuit clock signal 60 provided to the PLL circuitry 10 to contain a count value which allows for determining the time interval between, or period of, neighboring incoming timing signals 18, generated by the packet counter 16. The packet counter 30 is responsive to the timing signal 20 supplied via the timing controller 22 to reset its prevailing count value to thereby determine the interval or period of the timing signal 18. The packet counter 30 thus carries out its count-up operation. The packet counter 30 has its output 32 connected to a delay buffer 34.

The packet counters 16 and 30 are adapted to increment in the illustrative embodiment. Alternatively, either or both of the counters 16 and 30 may be designed to decrement in response to the respective clock signals 14 and 60.

The delay buffer 34 receives the system timing information 36 obtained from packets received by the receiver. The delay buffer 34 is a double-buffer circuit for holding a count value of the packet counter 30 for at least two packet intervals. Specifically, the delay buffer 34 is adapted to hold the count values prevailing at the time of receipt of the current and previous system timing information 36. The count values 38 are developed from its output line 38 which is connected to a difference circuit 40.

The difference circuit 40 includes a comparator, not shown, for calculating the difference between the two count values retained in the delay buffer 34 to find out a resultant value from the comparison. The system timing information 36 occurs at time positions dependent upon the transmitter system timing. The system timing information 36 is not synchronous with the clocks of the receiver circuit. Thus, the present embodiment is provided with the function of comparing plural count values of the packet counter 30 with each other to find out a value of comparison to exploit the three asynchronous clocks, i.e. the clock of the receiver circuitry 60, the clock signal for receiver system operation 14 and the clock for transmitter system operation, to thereby establish and maintain system synchronization. The difference circuit 40 has its output 42 connected to an overflow corrector 44.

The overflow corrector 44 is adapted for subtracting from the output value 42 a count value 18 which is held in the packet counter 16 and corresponds to the interval between neighboring pieces of incoming timing information 36 if the output value 42 of the difference circuit 40 is so great that it exceeds a predetermined threshold equivalent to an error which is expected with the system synchronization taken into account. Further, the overflow corrector 44 is adapted for adding to the output value 42 a count value 18 held in the packet counter 16 and corresponding to the interval between neighboring pieces of incoming timing information 36 if the output value 42 of the difference circuit 40 is equal to or smaller than the predetermined threshold.

It would otherwise be possible that the incoming timing of the system timing information 36 may cause the packet counter 30 to hold any count value between zero and the maximum count value counted by the packet counter 30 and prevailing just previous to returning to zero, thus rendering the difference circuit 40 presenting the difference value acutely dependent upon the count value 18 developed by the packet counter 16 and corresponding to the interval between the neighboring pieces of incoming system timing information 36. With the illustrative embodiment, that concern can be overcome by the overflow corrector 44. The overflow corrector 44 has its output port 46 connected to a phase difference detector 48.

The phase difference detector 48 functions as comparing the value of comparison 42 produced by the difference circuit 40 and received from the overflow corrector 44 to a predetermined reference value. If the value of comparison is smaller than the reference value, then the phase difference detector 48 outputs a logical value "1" on its output line 50, and, otherwise, the phase difference detector transfers a logical value "0" on its output line 50. The value of comparison 42 of the phase difference detector 48 indicates a cumulative offset of the clock position. If the value of comparison 42 is greater than a predetermined threshold value, then the phase difference detector 48 discards the value of comparison 42. The phase difference detector 48 in turn uses a newly acquired value of comparison to correct the clock frequency of receiver system operation 14. Otherwise, the phase difference detector 48 produces zero. The frequency correction information, thus generated, is developed on the output line 50 of the phase difference detector 48. The output line 50 of the phase difference detector 48 is connected to an integrator 52.

The integrator 52 serves to integrate an output value 50 of the phase difference detector 48. The integrator 52 is operative in timed with the system timing information 36 to output a resultant integrated value on its output line 54. The integrator 52 of the instant embodiment is structured to integrate the information on frequency correction 50 when the system timing information 36 is obtained. Thus, the integrator 52 halts its integrating operation in case of dropout of the system timing information 36, and holds the information on frequency correction prevailing just before the dropout. The integrator 52 has its output port 54 connected to a loop-gain circuit 56.

The loop-gain circuit 56 serves to be responsive to the input integrated value 54 to adjust the loop gain of the present phase-locked loop 10. The loop-gain circuit 56 transfers a control signal on its output line 58 which is connected to an oscillator 12. The packet counter 30, delay buffer 34, difference circuit 40, overflow corrector 44, phase difference detector 48, integrator 52 and loop-gain circuit 56 are fed with the circuit clock 60 of the receiver, in which the phase-locked loop 10 is installed, so that these components are run in response to the circuit clock 60 as the operating clock thereof.

Figure 2:
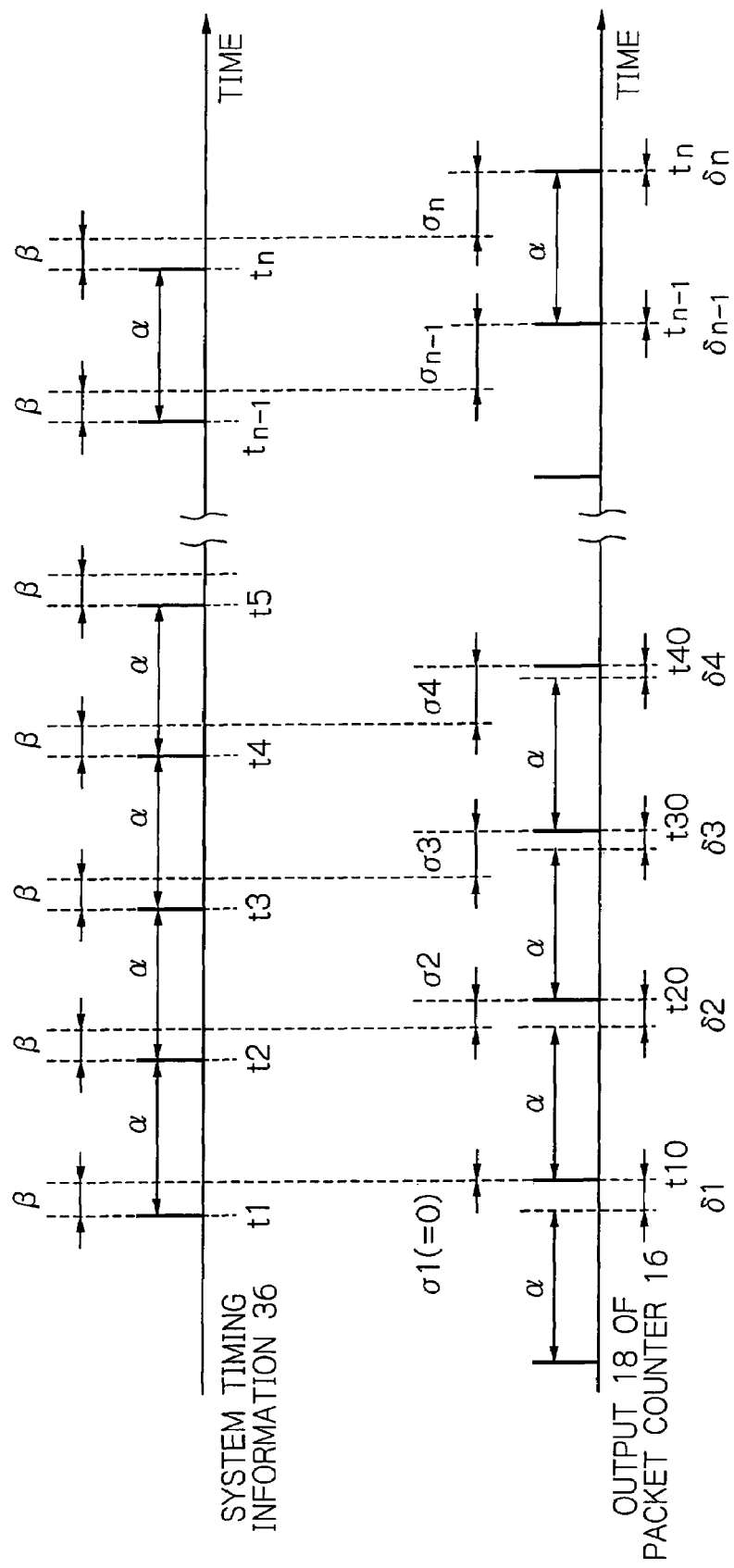
FIG. 2 is a timing chart useful for understanding the operation of restoring system synchronization in the illustrative embodiment shown in FIG. 1.

The operation for establishing the system synchronization will better be understood with reference to FIG. 2. The system timing information 36 is supplied to the phase-locked loop 10 with a period, or interval, $\alpha$ at time points t1 to tn as shown. The period $\alpha$ is predetermined particularly to a system in which the transmitter and receiver are involved. The system timing information 36, which has begun to be acquired at time t1, is normally of acquired from a packet received after the occurrence of packet dropout only for illustrative purpose. The packet counter 16 outputs a count value 18 at time t10 after lapse of a period of time $\beta$ after time t1. In this case, the number, or count, of offset $\sigma$1 counted as from the timing after lapse of time $\beta$ since time t1 commences from "0". The count value 18 is output with a time delay of time $\delta$1 (offset correction value) as from the output timing of the count value 18 which was so far generated with the period $\alpha$.

Now, when the system timing information 36 is entered at time t2, the count value 18 is output from the packet counter 16 after lapse of the count of offset $\sigma$2 as from the lapse of the time $\beta$. In this case, the count value 18 is output at time t20 when the time (offset correction value) $\delta$2 has elapsed after lapse of the period $\alpha$ as from time t10. In this manner, the count value 18 is output at time points t30, t40, ..., tn-1, tn. The frequency of the clock signal for receiver system operation 14 converges, and the offset correction values $\delta$1 to $\delta$n are gradually decreased, until finally the offset correction value $\delta$n converges to "0". On the other hand, the number of offsets $\sigma$1 to $\sigma$n thus counted increments as the frequency of the clock signal for receiver system operation 14 converges, until the count number of offsets is stagnant or remains at a certain value $\sigma$n. In this manner, the packet counter 16 will output the count value 18 at the period synchronized with the period $\alpha$ of the system timing information 36.

Thus, the operation is repeated until the frequency 18 is synchronized with the system timing information 36 of transmission packets. When synchronization is thus restored, the phase of the clock for receiver system operation 14 with respect to the system timing information 36 will converge to the predetermined constant value.

In the present embodiment, the output 18 of the packet counter 16 is offset with a certain phase offset value corresponding to the count of offset an from the timing when the system timing information 36 is applied. However, the period or time interval as which the count value 18 is output is synchronized with the input period $\alpha$ of the system timing information 36. In this manner, synchronization is rapidly recovered following the occurrence of packet dropout to generate the receiver system operation clock signal 14, so that processing on received packets will effectively be carried out.

The entire disclosure of Japanese patent application No. 2006-43939 filed on Feb. 21, 2006, including the specification, claims, accompanying drawings and abstract of the disclosure is incorporated herein by reference in its entirety.

While the present invention has been described with reference to the particular illustrative embodiment, it is not to be restricted by the embodiment. It is to be appreciated that those skilled in the art can change or modify the embodiment without departing from the scope and spirit of the present invention.

What is claimed is:

1. A phase-locked loop for maintaining system synchronization between a transmitter and a receiver in a wireless communications system of packet transmission, said phase-locked loop comprising:

an oscillator having an oscillation frequency controlled by a control signal for generating a clock for receiver system operation;

a first counter operative directly in response to the clock for receiver system operation for autonomously counting the clock recursively at a period of incoming system timing information estimated to generate a first count value every period of the incoming system timing information;

a second counter for counting a circuit clock of the receiver distinct from the clock for system operation to generate a second count value, the second count value being reset in response to the first count value;

a holding circuit for holding the second count values corresponding to at least two packet intervals and detecting the system timing information transmitted from the transmitter;

a difference circuit for comparing a temporally previous second count value held by said holding circuit with a temporally posterior second count value;

an adder/subtractor for subtracting from or adding to an output of said difference circuit a value equivalent to an estimated period of incoming system timing information which is estimated with the circuit clock taken into account if the output of said difference circuit is, respectively, larger or smaller than a value expected with the system synchronization taken into account;

a phase difference detector for changing the value obtained by said adder/subtractor to zero to output the resulting zero if the value obtained by said adder/subtractor is larger than a reference value expected with the system synchronization taken into account, and otherwise directly outputting the value obtained by said adder/subtractor; and an integrator for integrating an output of said phase difference detector, on acquisition of the system timing information from the transmitter to apply a result of integration to said oscillator as the control signal, whereby the system synchronization of the receiver with the transmitter is substantially maintained through packet dropout.

* * * * *